United States Patent
Dennison

(10) Patent No.: US 7,229,887 B2
(45) Date of Patent: Jun. 12, 2007

(54) METHOD TO SELECTIVELY REMOVE ONE SIDE OF A CONDUCTIVE BOTTOM ELECTRODE OF A PHASE-CHANGE MEMORY CELL AND STRUCTURE OBTAINED THEREBY

(75) Inventor: Charles Dennison, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 25 days.

(21) Appl. No.: 10/340,506

(22) Filed: Jan. 10, 2003

(65) Prior Publication Data

US 2003/0136983 A1    Jul. 24, 2003

Related U.S. Application Data

(62) Division of application No. 09/737,614, filed on Dec. 13, 2000, now Pat. No. 6,649,928.

(51) Int. Cl.
*H01L 21/20* (2006.01)
(52) U.S. Cl. .................................. 438/387; 438/391
(58) Field of Classification Search ................ 438/95, 438/244, 248, 387, 391
See application file for complete search history.

(56) References Cited

U.S. PATENT DOCUMENTS

| | | | | |
|---|---|---|---|---|
| 5,753,547 A | * | 5/1998 | Ying | 438/253 |
| 5,808,855 A | * | 9/1998 | Chan et al. | 361/321.4 |
| 6,031,287 A | * | 2/2000 | Harshfield | 257/734 |
| 6,147,395 A | * | 11/2000 | Gilgen | 257/529 |
| 6,337,266 B1 | * | 1/2002 | Zahorik | 438/618 |
| 2004/0175857 A1 | * | 9/2004 | Lowrey et al. | 438/95 |

FOREIGN PATENT DOCUMENTS

JP    2003332530 A  * 11/2003

* cited by examiner

Primary Examiner—N. Drew Richards

(57) ABSTRACT

The invention relates to a phase-change memory device. The device includes a lower electrode disposed in a recess of a first dielectric. The lower electrode comprises a first side and a second side. The first side communicates to a volume of phase-change memory material. The second side has a length that is less than the first side. Additionally, a second dielectric may overlie the lower electrode. The second dielectric has a shape that is substantially similar to the lower electrode.

The present invention also relates to a method of making a phase-change memory device. The method includes providing a lower electrode material in a recess. The method also includes removing at least a portion of the second side.

14 Claims, 15 Drawing Sheets

METHOD TO SELECTIVELY REMOVE ONE SIDE OF A CONDUCTIVE BOTTOM ELECTRODE OF A PHASE-CHANGE MEMORY CELL AND STRUCTURE OBTAINED THEREBY

This is a Divisional of application Ser. No. 09/737,614, filed Dec. 13, 2000, now U.S. Pat. No. 6,649,928.

BACKGROUND OF THE INVENTION

1. Field of the Invention

The present invention relates to a phase-change memory device. More particularly, the present invention relates to a lower electrode in a chalcogenide memory cell. In particular, the present invention relates to a lower electrode with increased packing density.

2. Description of Related Art

As microelectronic technology progresses, the need has arisen for new data retention schemes. One such data retention scheme is the chalcogenide phase-change technology. Typically, a phase-change memory device includes a polysilicon lower electrode, also known as a "matchstick".

One challenge of forming a lower electrode in a phase-change memory cell is to shrink the cell size while not losing alignment tolerances. FIG. 16a illustrates the alignment tolerance 1 of a volume of memory material 2 over a lower electrode 3. There is required to be sufficient alignment tolerance 1 that only a first contact 6 of memory material 2 is made by one vertical section 7 of lower electrode 3. Further, the dimension of the volume of memory material 2 must be sufficient to assure a substantially complete overlay contact of vertical section 7, but have the alignment tolerance that is needed.

FIG. 16b illustrates the situation where a smaller lower electrode 4 is used and alignment tolerances are insufficient to prevent a second contact 8. If a double contact occurs or is likely to occur, several processes may be carried out in order to cause one side of lower electrode 4 to be what is called a "dead matchstick". FIG. 16b illustrates the situation where the alignment tolerance has failed to make only a first contact 6. If both sides of the lower electrode 4 are conducting, than an inadequate memory operation will occur when there is misalignment as shown in FIG. 16b. To allow such misalignment, and still achieve sufficient memory operation, one previously disclosed method is to selectively dope and make conductive vertical section 7 and not vertical section 4, thus to create an undoped or dead matchstick 4.

After the formation of a recess in a substrate that exposes an active area, a conformal introduction of lower electrode material is required. Lower electrode material is typically polycrystalline silicon. The conformal introduction of lower electrode material that is polycrystalline silicon may follow conventional introduction techniques known to those skilled in the art including chemical vapor deposition (CVD) techniques. Thereafter, a dopant is introduced into the polycrystalline silicon to adjust the resistivity, in one aspect, to lower the resistivity of the material. A suitable dopant is a P-typed dopant such as boron introduced. From the combination of polysilicon and dopant, a silicidation process is required to form a silicide of the lower electrode. This process typically is a doping, a first anneal, a wet strip, and a second anneal.

After proper doping and fill into the trench, a planarization step is required to remove any horizontal component of the lower electrode. Thereafter, a modifier material must be introduced into a portion of the lower electrode material to combine and/or react with the lower electrode material near the ton to form a different material. The modifier is introduced to raise the local resistance of the lower electrode material. By modifying a portion of the lower electrode material, the resistivity at that modified portion may be changed. Because the modifying material is of a higher resistivity, the lower electrode may not provide sufficiently suitable ohmic contact between the lower electrode and the volume of memory material for a desired application. In such cases, modifying material may be introduced into the lower electrode at a depth below the exposed surface of the lower electrode. For example, a lower electrode of polycrystalline silicon may have polycrystalline silicon at the exposed surface and a modifying material at a depth below the exposed surface. Additionally, barrier materials may be added to prevent cross-contamination between the chalcogenide material and the lower electrode.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The invention relates to a memory device that is used with phase-change material to memorialize data storage. The device uses a lower electrode material that is referred to as a "matchstick". The inventive process includes providing a lower electrode in a first dielectric film that has first side and a second side. The second side is removed in order to allow the first side to be the only conductive section of the lower electrode. Thereafter, a volume of phase change memory material may be formed over the first side. Either a high resistivity metal compound may be used as the lower electrode, or a polysilicon compound may be used such as a polysilicon or polycide composite.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientation. Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover the drawings show only the structures necessary to understand the present invention. Additional structures known in the art have not been included to maintain the clarity of the drawings.

Figure 1:
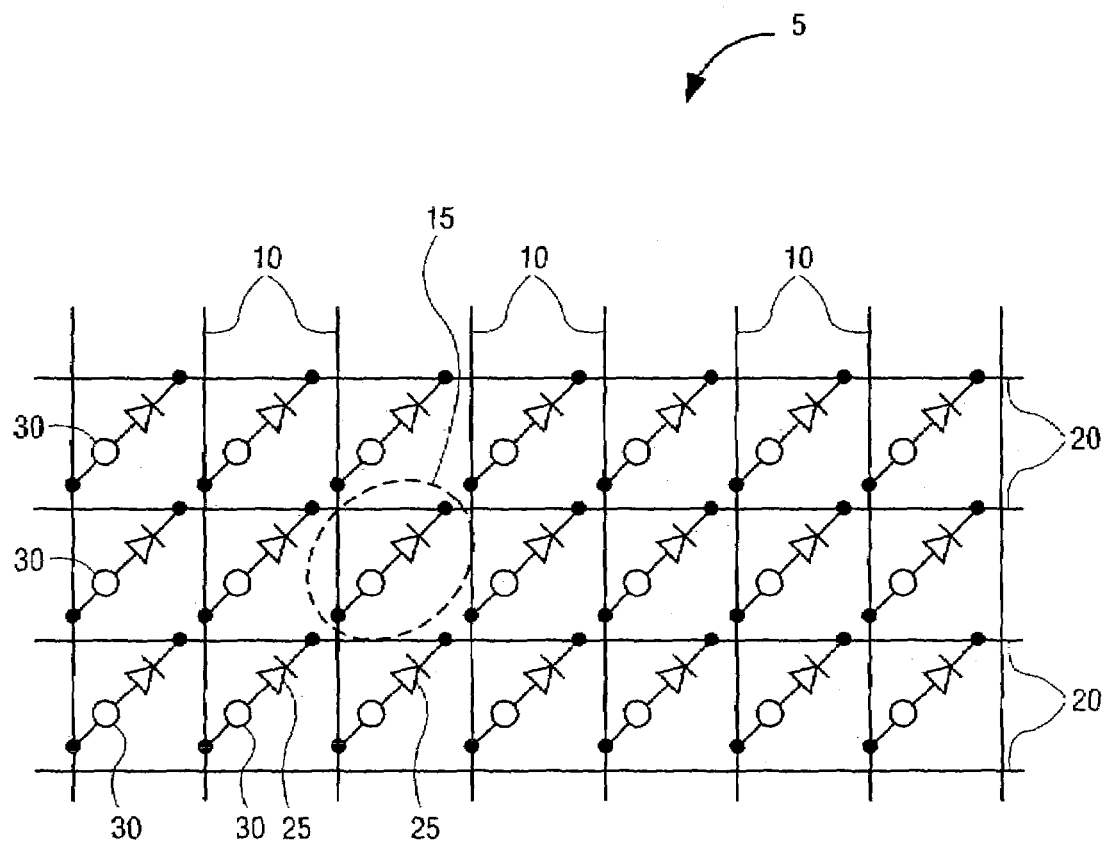
FIG. 1 is a schematic diagram of an array of memory elements according to an embodiment of the invention.

FIG. 1 shows a schematic diagram of an embodiment of a memory array comprised of a plurality of memory elements presented and formed in the context of the invention. In this example, the circuit of memory array 5 includes an array with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art. One purpose of the array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer may be reduced through singulation into discrete die or chips, some or all of the die or chips having a memory array formed thereon. Additional addressing circuitry such as sense amplifiers, decoders, etc. may be formed in a similar fashion as known to those of skill in the art.

Figure 2:
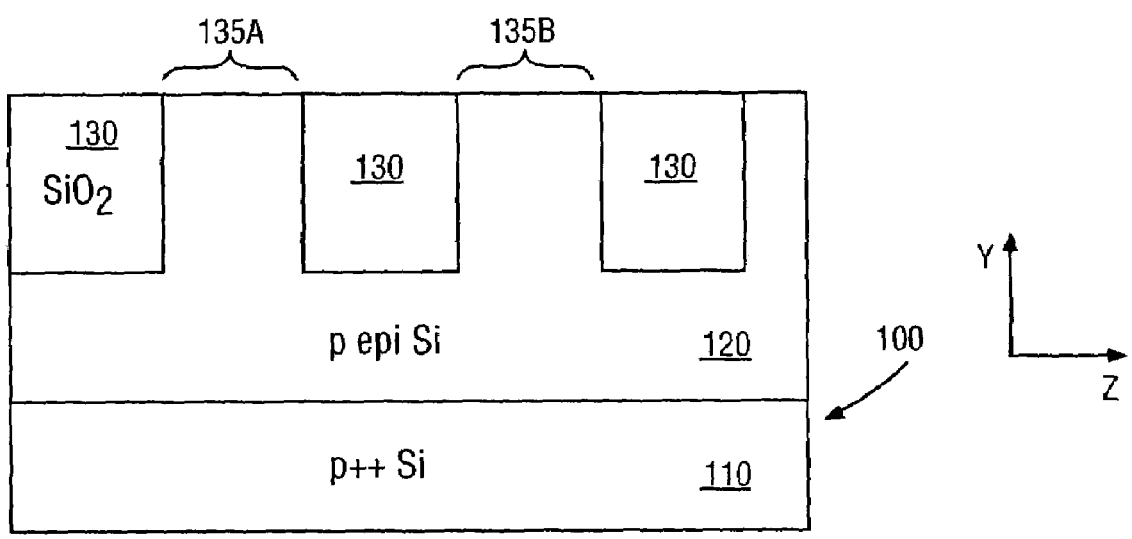
FIG. 2 schematically illustrates a cross-sectional planar side view of a portion of a semiconductor substrate having dielectric trenches formed therein defining a z-direction thickness of a memory cell in accordance with one embodiment of the invention of forming a memory element on a substrate.

FIGS. 2–15 illustrate the fabrication of representative memory element 15 of FIG. 1. FIG. 2 shows a portion of substrate 100 that is, for example, a semiconductor substrate. In this example, a P-type dopant such as boron is introduced in a deep portion 110. In one example, a suitable concentration of P-type dopant is on the order of above $5 \times 10^{19} - 1 \times 10^{20}$ atoms per cubic centimeters (atoms/cm$^3$) rendering deep portion 110 of substrate 100 representatively P$^{++}$. Overlying deep portion 110 of substrate 100, in this example, is an epitaxial portion 120 of P-type epitaxial silicon. In one example, the dopant concentration in epitaxial portion 120 is on the order of about $10^{16-1017}$ atoms/cm$^3$. The introduction and formation of epitaxial portion 120 as P-type, and deep portion 110 may follow techniques known to those of skill in the art.

FIG. 2 also shows first shallow trench isolation (STI) structures 130 formed in epitaxial portion 120 of substrate 100. As will become apparent in the subsequent discussion, STI structures 130 serve, in one aspect, to define the z-direction thickness of a memory element cell, with at this point only the z-direction thickness of a memory element cell defined. In another aspect, STI structures 130 serve to isolate individual memory elements from one another as well as associated circuit elements such as transistor devices formed in and on substrate 100. STI structures 130 are formed according to techniques known to those skilled in the art.

Figure 3:
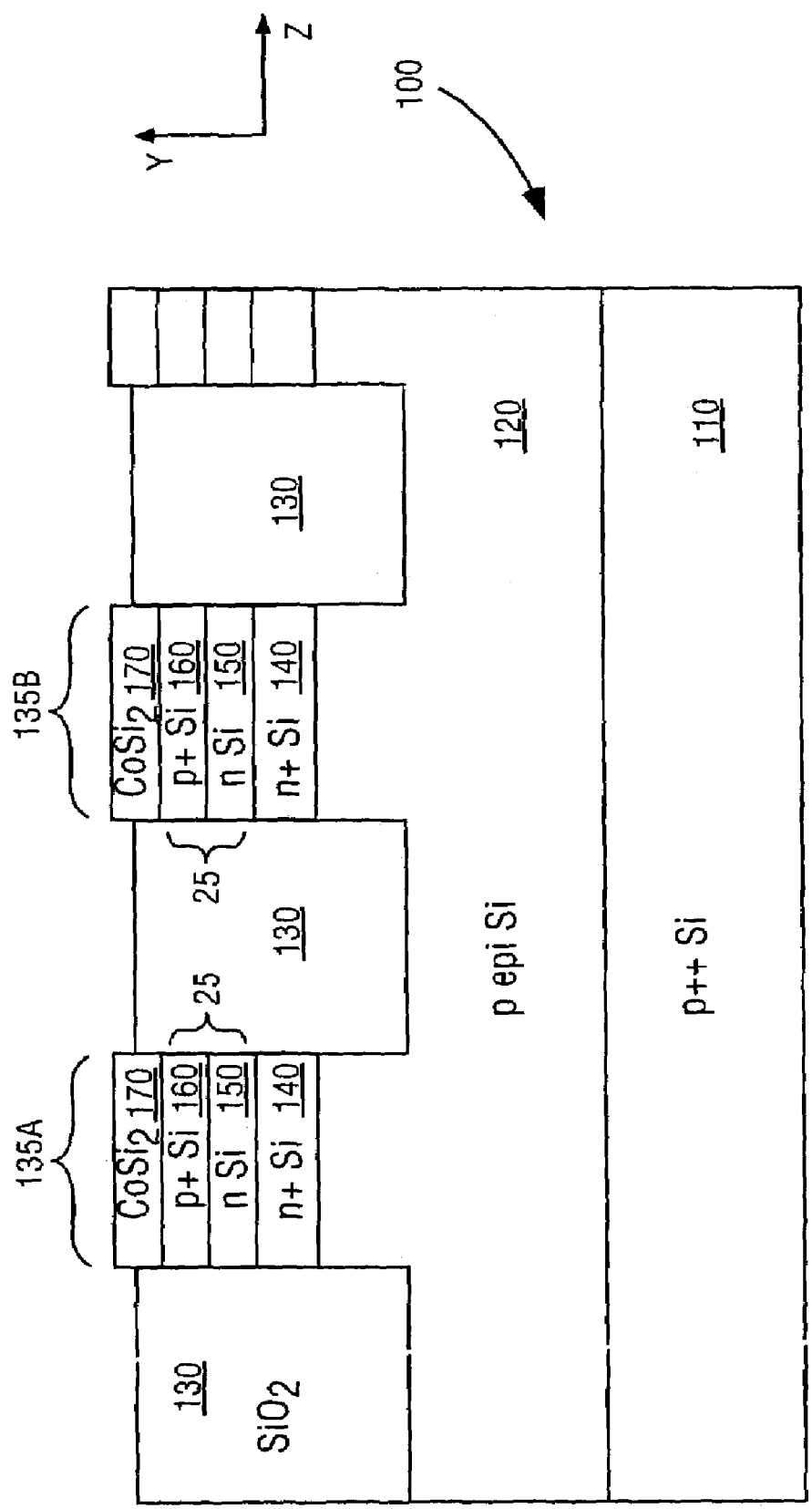
FIG. 3 shows the structure of FIG. 2, through the same cross-sectional view, after the introduction of dopants to form an isolation device for a memory element in accordance with one embodiment of the invention.

FIG. 3 shows the structure of FIG. 2 after a further fabrication operation in memory cell regions 135A and 135B. In one embodiment, memory cell regions 135A and 135B are introduced as strips with the x-direction dimension greater than the z-direction dimension. Overlying epitaxial portion 120 of substrate 100 is first conductor or signal line material 140. In one example, first conductor or signal line material 140 is N-type doped silicon formed by the introduction of, for example, phosphorous or arsenic to a concentration on the order of about $10^{18-1019}$ atoms/cm$^3$ such as N$^+$ silicon. In this example, first conductor or signal line material 140 serves as an address line, a row line such as row line 20 of FIG. 1. Overlying first conductor or signal line material 140 is an isolation device such as isolation device 25 of FIG. 1. In one example, isolation device 25 is a PN diode formed of N-type silicon portion 150 that may have a dopant concentration on the order of about $10^{17-1018}$ atoms/cm$^3$ and P-type silicon portion 160 that may have a dopant concentration on the order of about $10^{19-1020}$ atoms/cm$^3$. Although a PN diode is shown, it is to be appreciated that other isolation structures are similarly suitable. Such isolation devices include, but are not limited to, MOS devices.

Referring to FIG. 3, overlying isolation device 25 in memory cell regions 135A and 135B is a reducer material 170 of, in this example, a refractory metal silicide such as cobalt silicide ($CoSi_2$). Reducer material 170, in one aspect, serves as a low resistance material in the fabrication of peripheral circuitry such as addressing circuitry of the circuit structure on the chip. Thus, reducer material 170 may not be required in terms of forming a memory element as described. Nevertheless, because of its low resistance property and its etch stop property along with the desire to avoid adding any additional lithograph processes to mask it off from the memory cell, its inclusion as part of the memory cell structure between isolation device 25 and memory element 30 is utilized in this embodiment.

Figure 4:
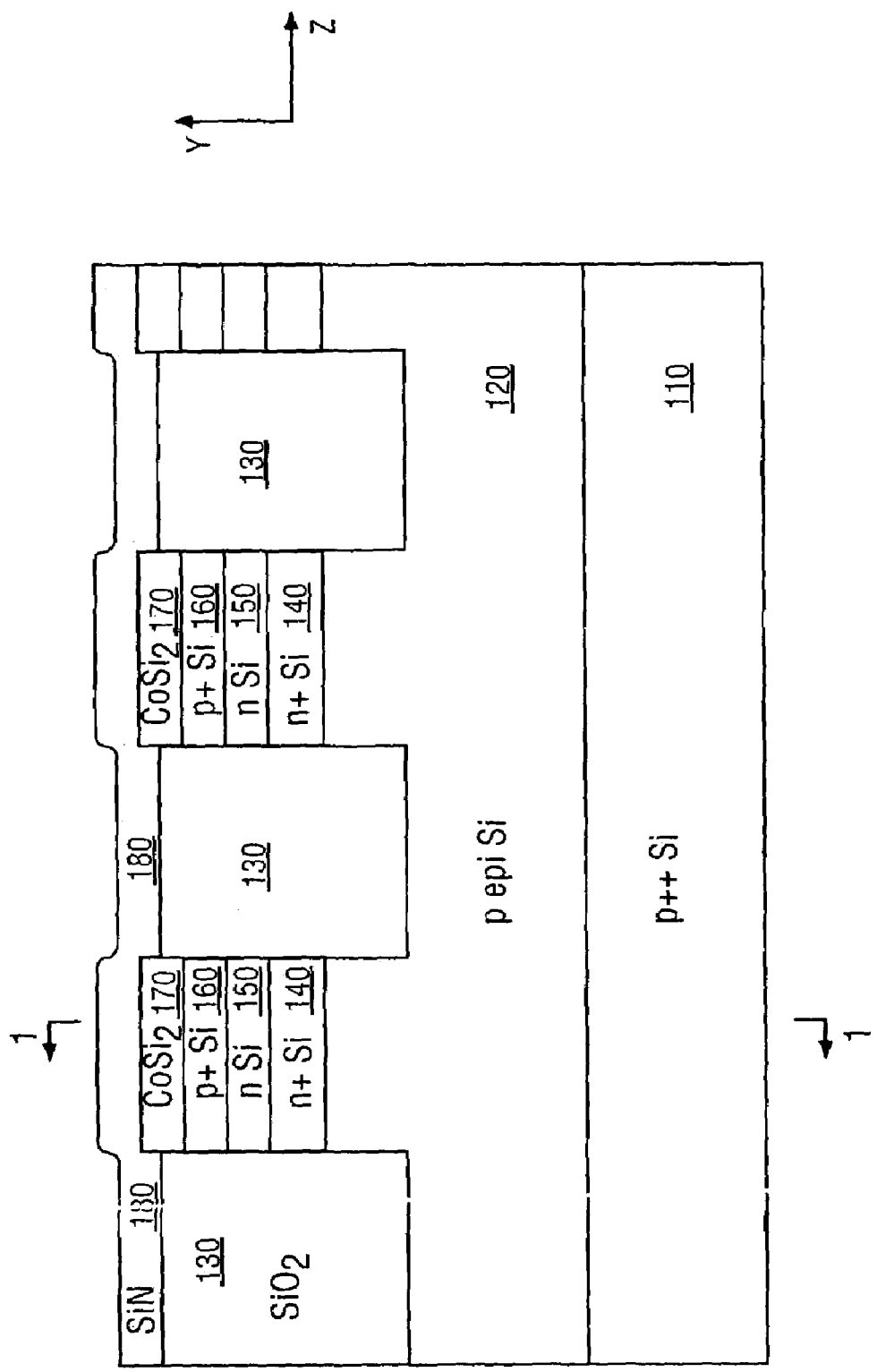
FIG. 4 shows the structure of FIG. 3 after the introduction of a masking material over the structure in accordance with one embodiment of the invention.
Figure 5:
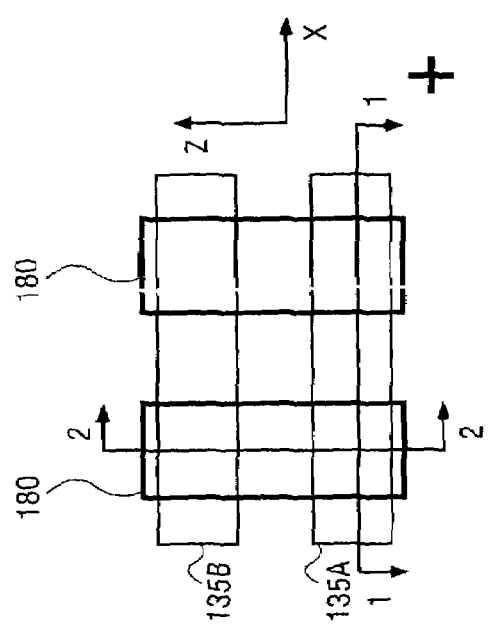
FIG. 5 shows a schematic top view of the structure of FIG. 4.
Figure 6:
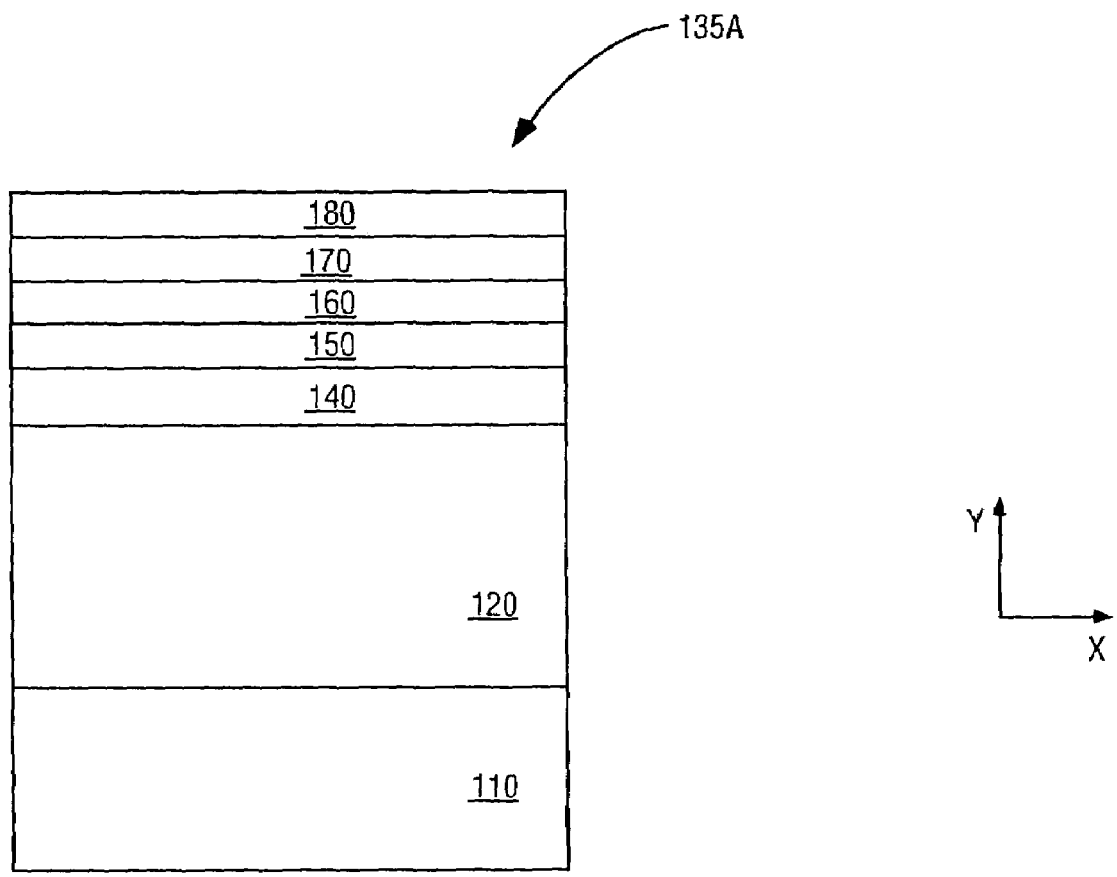
FIG. 6 shows the cross-section of the structure of FIG. 4 through line 1—1.

FIG. 4 shows the structure of FIG. 3 after the introduction of a masking material 180. As will become clear later, masking material 180 serves, in one sense, as an etch stop for a subsequent etch operation. FIG. 5 schematically shows memory cell regions 135A and 135B in an xz plane. Overlying the memory cell is masking material 180. FIG. 6 shows a cross-sectional side view of memory cell region 135A through line 1—1 of FIG. 5 in an xy perspective. In one embodiment, a suitable material for masking material 180 is a dielectric material such as silicon nitride ($Si_3N_4$) although other material may be used such as silicon oxynitride.

Figure 7:
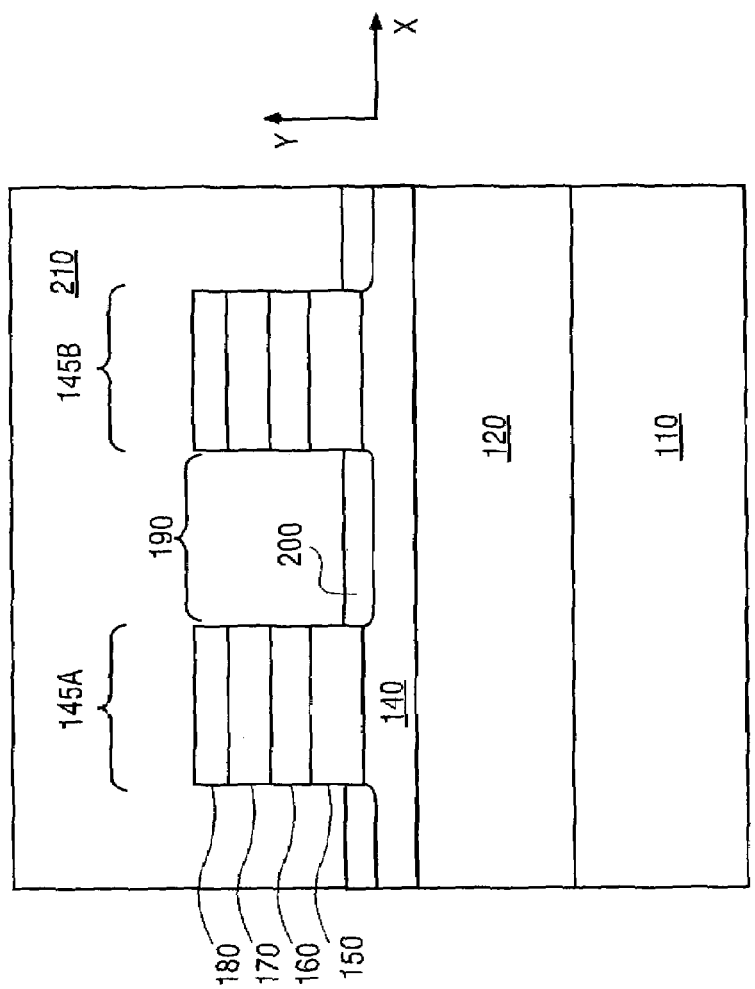
FIG. 7 shows the structure of FIG. 5, through the same cross-sectional view, after the patterning of the x-direction thickness of a memory cell, the introduction of a dopant between the cells, and the introduction of a dielectric material over the structure.

FIG. 7 shows the structure of FIG. 6 from an xy perspective after patterning of the x-direction thickness of the memory cell material to form a trench 190. FIG. 7 shows two memory cells 145A and 145B patterned from memory cell region 135A depicted in FIG. 5. The patterning may be accomplished using conventional techniques for etching, in this example, refractory metal silicide and silicon material to the exclusion of masking material 180. The definition of the x-direction thickness involves, in one embodiment, an etch to conductive material 150 (N-type silicon in this embodiment) of the memory line stack to define memory cells 145A and 145B of memory cell region 135A. In the case of an etch, the etch proceeds through the memory line stack to, in this example, a portion of a conductor or signal line that is in this case conductive material 150. A timed etch may be utilized to stop an etch at this point.

Following the patterning, N-type dopant is introduced at the base of each trench 190 to form pockets 200 having a dopant concentration on the order of about $10^{18-10^{20}}$ atoms/$cm^3$ to form an $N^+$ region between memory cells 145A and 145B. Pockets 200 serve, in one sense, to maintain continuity of a row line and to reduce the row resistance. Dielectric material 210 of, for example, silicon dioxide material is then introduced over the structure to a thickness on the order of 100 Å to 50,000 Å.

Figure 8:
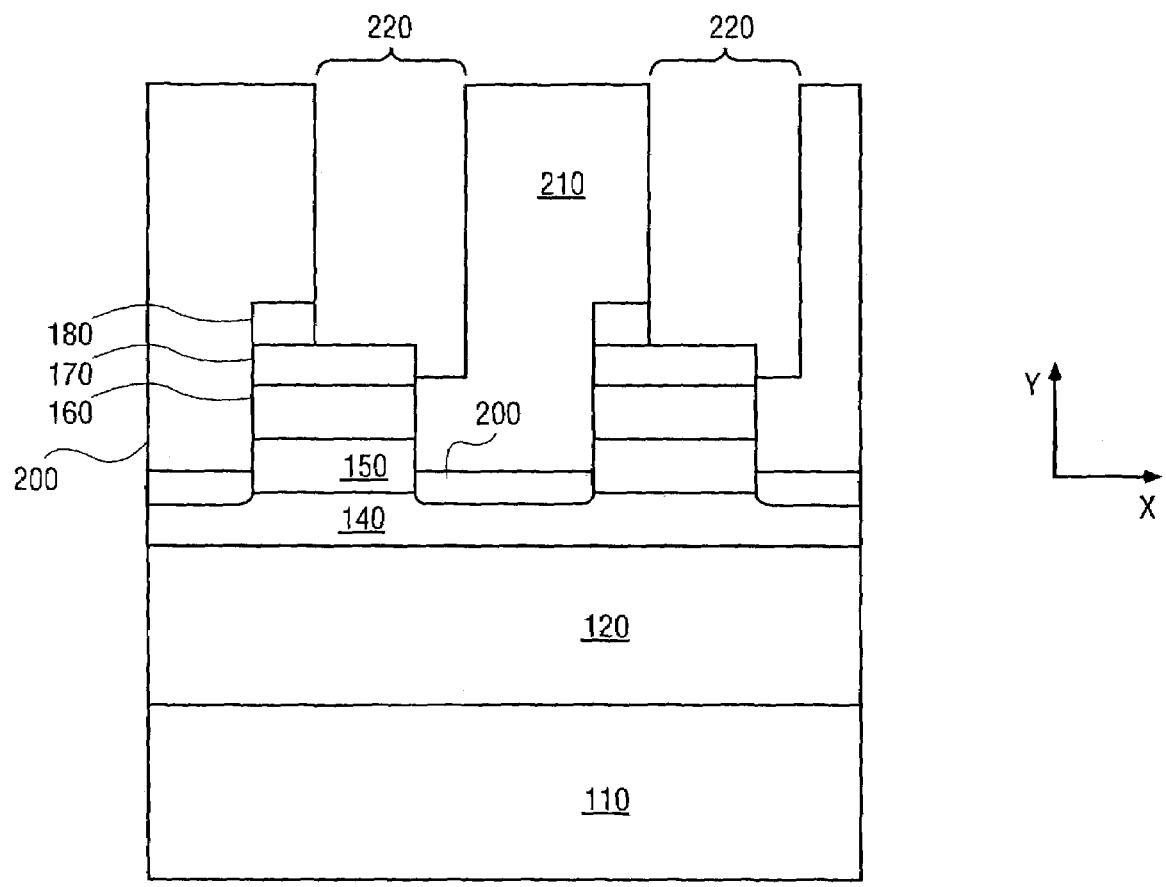
FIG. 8 shows the structure of FIG. 7, through the same cross-sectional view, after the formation of trenches through the dielectric material in accordance with one embodiment of the invention.
Figure 9:
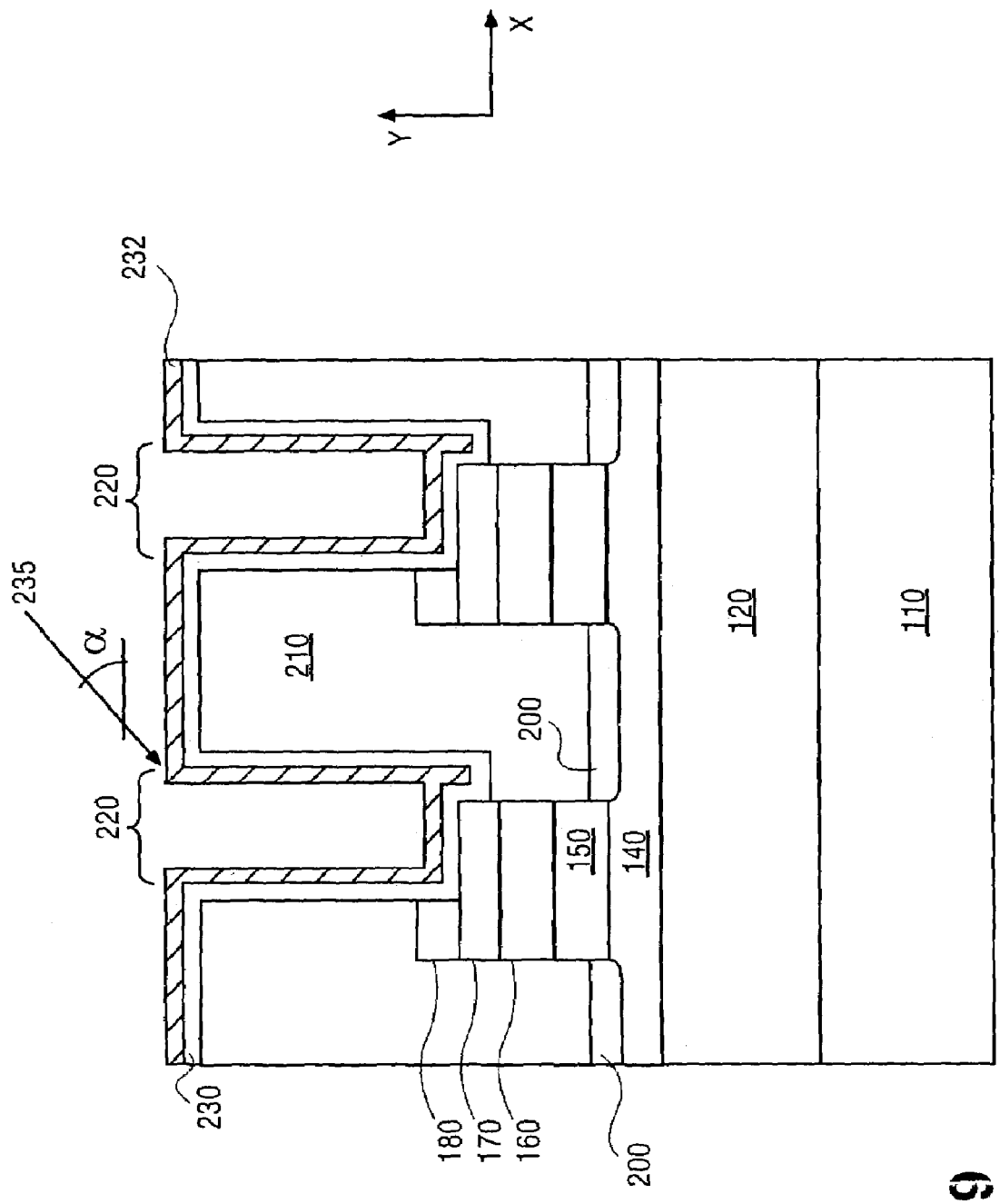
FIG. 9 shows the structure of FIG. 8, through the same cross-sectional view, after the introduction of an electrode material and deposition of hard mask material and angled implant of angle "alpha" into the deposited hard mask material over the structure in accordance with one embodiment of the invention.

FIG. 8 shows the structure of FIG. 7 after the formation of trenches 220 through dielectric material 210 and masking material 180 to reducer material 170. The formation of trenches 220 may be accomplished using etch patterning with an etchant(s) for etching dielectric material 210 and masking material 180 and selective to reducer material 170 such that reducer 170 may serve as an etch stop. Trench 220 may be referred to as a recess that is formed in first dielectric 210 to expose at least a portion of the memory cell stack as illustrated in FIG. 9. Although the recess is referred to as trench 220, the type of recess may be selected from a substantially circular recess, a rectangular (square) recess, and a trench recess. Where recess 220 is circular, dielectric material 210 forms what may be characterized as a container dielectric 210.

FIG. 9 illustrates the inventive process of forming a lower electrode in a phase-change memory device. The memory line stack may be referred to as an active area. A lower electrode material 230 is formed over first dielectric 210. FIG. 9 shows the structure of FIG. 8 after the conformal introduction of lower electrode material 230 that may be referred to as a metal compound film or alternatively as a polysilicon film. Following the introduction of lower electrode material 230, a second dielectric 232 is introduced over lower electrode material 230. Thereafter, an angled doping 235 is carried out in order to prepare a portion of second dielectric 232 for removal. The angle, α, may be selected in order to achieve a preferred amount of lower electrode material removal on one side.

Figure 10:
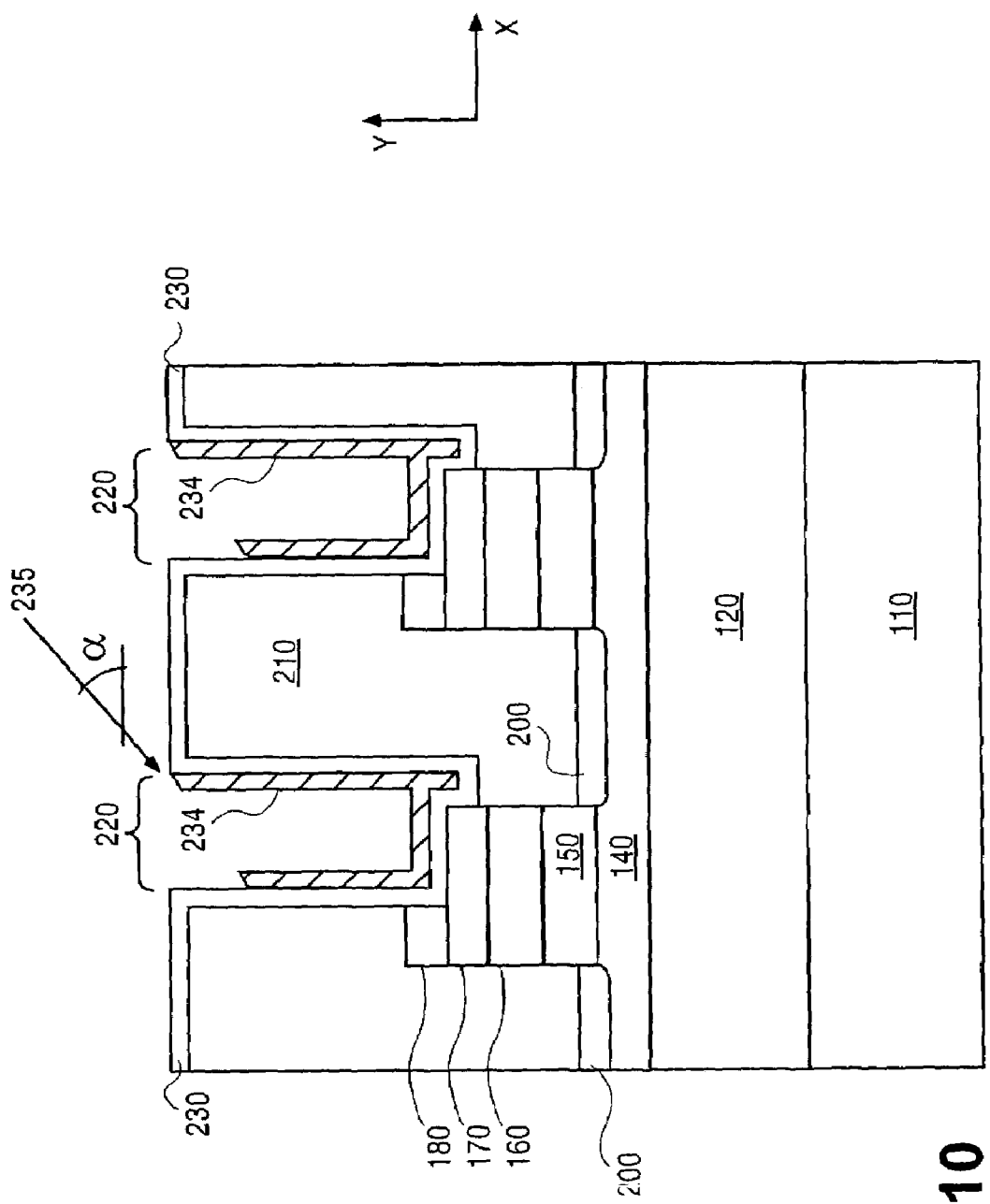
FIG. 10 shows the structure of FIG. 9, through the same cross-sectional view, after a selective etch back to remove the hard mask material that was exposed to the angled implant process depicted in FIG. 9.

FIG. 10 illustrates the structure depicted in FIG. 9 after further processing. Following the angled implant 235, a first etch is carried out to remove the implanted portion of second dielectric 232 to leave a second dielectric remainder 234. The first etch has the effect of exposing some of lower electrode material 230 that can be removed in a second etch.

Figure 11:
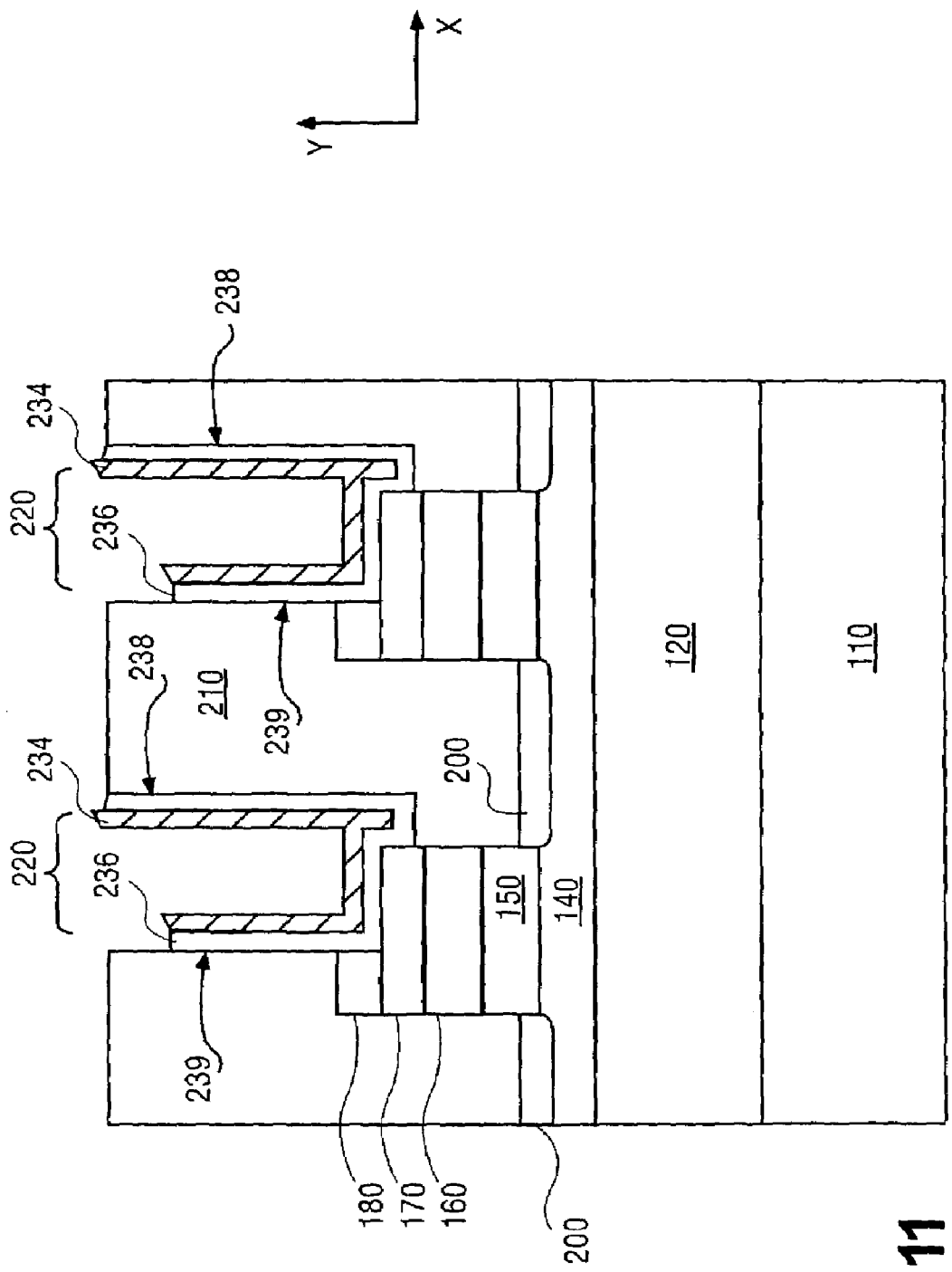
FIG. 11 shows the structure of FIG. 10, through the same cross-sectional view, after an etch back of substantially all the lower electrode that is not covered by the hard mask material to form a prominence of an upper section of the lower electrode because of the angled implant the right electrode in FIG. 11 is much lower than the right electrode.

FIG. 11 illustrates further processing of the structure depicted in FIG. 10. A second etch is carried out that is selective to first dielectric 210 and to second dielectric remainder 234. Lower electrode 230 is removed except for a lower electrode remainder 236, which is substantially overlaid or covered by second dielectric remainder 234. The lower electrode remainder 236 therefore has a first side 238 that reaches to the top of first dielectric 210, and a second side 239 that may be located at a significant distance below the top of first dielectric 210. In other words, second side 239 has a length that is less than first side 238.

Figure 12:
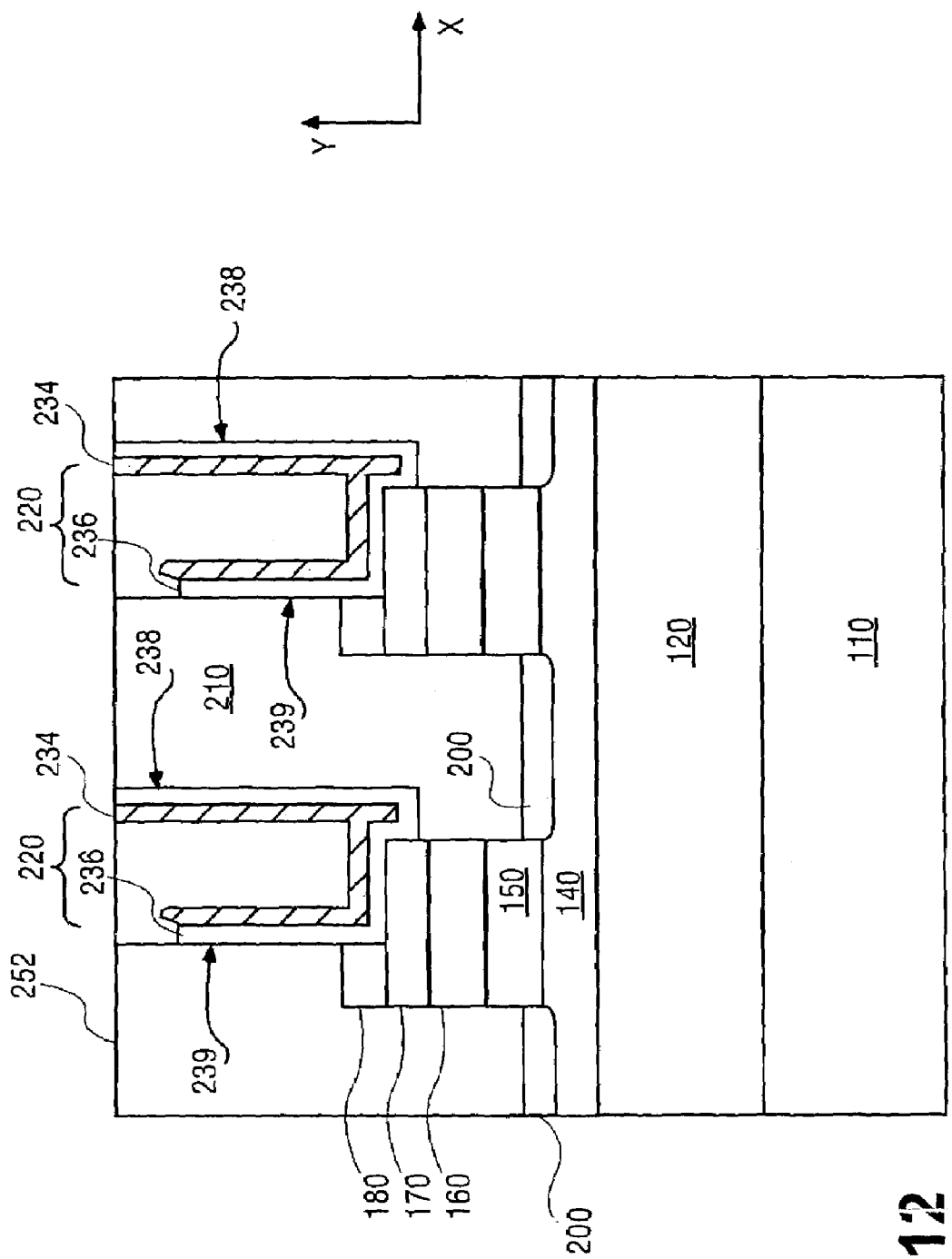
FIG. 12 shows the structure depicted in FIG. 11 after further processing including an insulating dielectric deposition and subsequent planarization that only exposes one side of the lower electrode at the top surface or upper level.

FIG. 12 illustrates further process of the structure depicted in FIG. 11. A filler dielectric 250 is formed in trench 220 and a planarization process is carried out that establishes a new upper level 252 of semiconductor structure 100. In one non-limiting embodiment, filler dielectric 250 may be formed by chemical vapor deposition of $SiO_2$ by high density plasma (HDP) of a silicon-containing substance such as tetra ethyl ortho silicate (TEOS) process and the like. The planarization process may be accomplished by methods such as chemical mechanical planarization (CMP), mechanical planarization, and the like. Removal of material may be accomplished by methods such as isotropic etchback, anisotropic etchback, and the like. In one etchback embodiment, a plasma etch is carried out under etchback conditions that are known.

It can be seen that second dielectric layer remainder 234 has a shape that is substantially similar to lower electrode remainder 236. The substantially similar shaper arises due to the masking effect of second dielectric remainder 234 upon lower electrode remainder 236. Because the amount of lower electrode material 230 is reduced to lower electrode remainder 236, a smaller amount of electrode is available to be heated. The smaller amount results in a power saving effect in that phase-change temperatures are achievable in lower electrode remainder 236 with a lower power draw.

New upper level 252 exposes first side 238 of lower electrode remainder 236, but does not expose second side 239 thereof. By this planarization process, first side 238 of lower electrode remainder 236 is prepared to be contacted with a volume of phase-change memory material.

Figure 13:
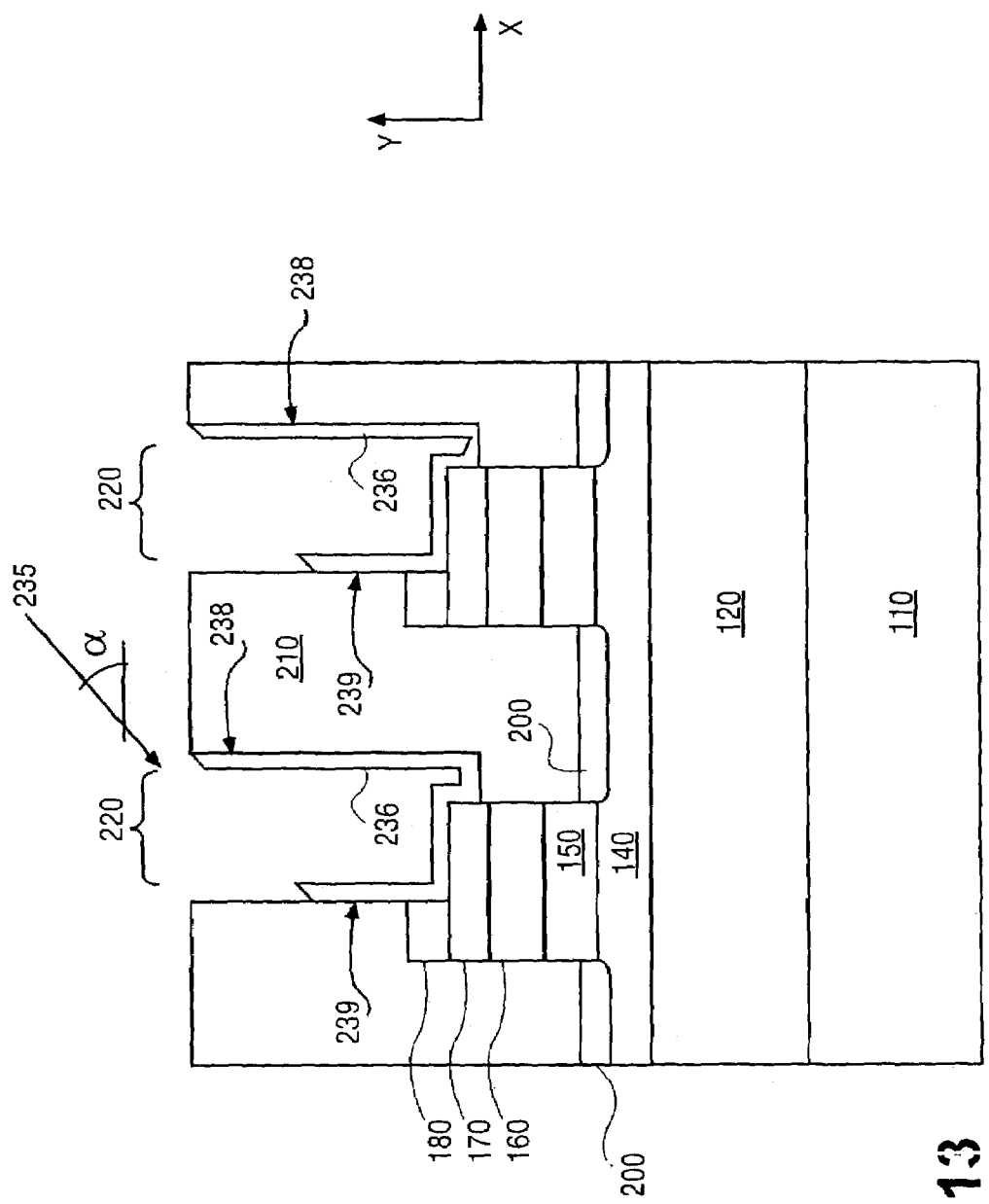
FIG. 13 shows one embodiment of forming a second dielectric film over the upper section where no additional hard mask is utilized to define the lower electrode.

In another embodiment of the present invention, no first dielectric layer 232 is formed over lower electrode material 230. Instead, angled implantation of lower electrode material 230 is carried out to an extent that lower electrode material that is not implanted retains a preferred etch selectivity in comparison to the implanted portion. FIG. 13 illustrates processing after such an angled implantation. By this method, process flow is simplified over other embodiments. Following angled implantation of lower electrode material 230, an etch such as an isotropic etch including either a wet etch or a dry isotropic etch may be carried out to remove a significant portion of second side 239 of lower electrode 230 to achieve lower electrode remainder 236. In yet another embodiment of the present invention, an angled ion milling etch (AIME), an angled reactive ion etch (ARIE), or the like may be carried out. Under such an etch process, the etch may simultaneously dope lower electrode material 230, and/or remove the doped material. By this embodiment, process flow is simplified even more in that no isotropic etch is required to remove lower electrode material disposed against second side 239.

Different materials may be selected for lower electrode 230. In one embodiment, the material of lower electrode material 230 may be a doped polysilicon that has sufficient doping to make it electrically conductive. Such doping conditions are well known in the art to make lower electrode material 230 electrically conductive. Where lower electrode 230 is a polysilicon film, it may be doped in situ during formation thereof, or it may be doped subsequent to formation thereof. In any event, doping is carried out to an extent that allows for Joule resistive heating therein sufficient to achieve a melt temperature of the phase change memory material.

In another embodiment, the material of lower electrode material 230 is preferably a high resistivity metal compound such as a metal nitride, a refractory metal nitride, a metal silicon nitride, a refractory metal silicon nitride, a metal silicide, and a refractory metal silicide. In one example, lower electrode material 230 is a refractory metal nitride compound such as tantalum nitride ($Ta_xN_y$) that, depending upon the desired resistivity, may be provided in either stoichiometric or other metal compound film solid solution ratios.

The introduction of lower electrode material 230 into trench 220 is conformal in the sense that lower electrode material 230 is introduced along the sidewalls and base of trench 220 such that lower electrode material 230 is in contact with reducer material 180. Lower electrode material 230 may include a metal and at least one of nitrogen or silicon. A given blend of metal compound may be accomplished by chemical vapor deposition (CVD) of at least one constituent of nitrogen and silicon in connection with the metal. Preferably, the composition of lower electrode material 230 is controlled by feed stream amounts to a CVD tool. Depending upon the specific embodiment, other CVD techniques may be used such as plasma enhanced CVD (PECVD).

In another embodiment, the formation of lower electrode material 230 is carried about by physical vapor deposition (PVD) and a target is selected that has a preferred composition for the final metal compound film 230. Alternatively, a plurality of targets may be combined to achieve a preferred metal compound film composition. In either PVD or CVD, coverage as defined as the ratio of wall deposited thickness to top-deposited thickness, is in a range from about 0.25 to about 1, and preferably about 0.5. In the present invention, CVD formation of lower electrode is preferred. Where lower electrode 230 is a high resistivity metal compound film, the metal compound may also be a refractory metal compound film tantalum nitride, titanium nitride, tungsten nitride, tanatalum silicon nitride, titanium silicon nitride, and tungsten silicon nitride. The metal compound, where it is a metal nitride, may have the formula $M_xN_y$, wherein x and y are configured for both stoichiometric and solid solution ratios. The metal compound, where it is a metal silicon nitride, may have the formula $M_xSi_zN_y$, wherein x, z, and y are configured for both stoichiometric and solid solution ratios.

Where a metal nitride is selected for lower electrode material 230, the metal may be selected from Ti and Zr and the like. It may also be selected from Ta and Nb and the like. It may also be selected from W and Mo and the like. It may also be selected from Ni and Co and the like. The metal nitride is preferably a refractory metal nitride compound of the formula $M_xN_y$. The ratio of M:N is in a range from about 0.5:1 to about 5:1, preferably from about 0.6:1 to about 2:1, and most preferably about 1:1. For example, one embodiment of the present invention is a $Ta_xN_y$ compound in the ratio from about 0.5:1 to about 5:1, preferably from about 0.6:1 to about 2:1, and most preferably about 1:1. Another example of an embodiment is a $W_xN_y$ compound in the ratio from about 0.5:1 to about 5:1, preferably from about 0.6:1 to about 2:1, and most preferably about 1:1.

In another embodiment of the invention, lower electrode material 230 may be a metal silicon nitride compound. The metals may be selected from the metal may be selected from Ti and Zr and the like. It may also be selected from Ta and Nb and the like. It may also be selected from W and Mo and the like. It may also be selected from Ni and Co and the like. The metal silicon nitride compound may have the formula $M_xSi_zN_y$, and wherein the ratio of M:Si:N is in a range from about 1:0.5:0.5 to about 5:1:1. Preferably, the ratio is in a range from about 1:1:0.5 to 1:0.5:1, and most preferably about 1:1:1. In one embodiment, a lower electrode material compound is $Ti_xSi_yN_z$ in a ratio from about 1:0.5:0.5 to about 5:1:1, preferably from about 1:1:0.5 to 1:0.5:1, and most preferably about 1:1:1.

In another embodiment, the lower electrode may be a metal silicide compound. The metals may be selected from the metal may be selected from Ti and Zr and the like. It may also be selected from Ta and Nb and the like. It may also be selected from W and Mo and the like. It may also be selected from Ni and Co and the like. The metal silicide compound may have the formula $M_xSi_z$, wherein the ratio of M:Si: is in a range from about 0.5:1 to about 5:1. In one embodiment, a lower electrode material compound is $Ti_xSi_y$ in a ratio from about 0.5:1 to about 5:1, preferably from about 0.6:1 to about 2:1, and most preferably about 1:1. In another embodiment, a lower electrode material compound is $W_xSi_y$ in a ratio from about 0.5:1 to about 5:1, preferably from about 0.6:1 to about 2:1, and most preferably about 1:1.

Figure 14:
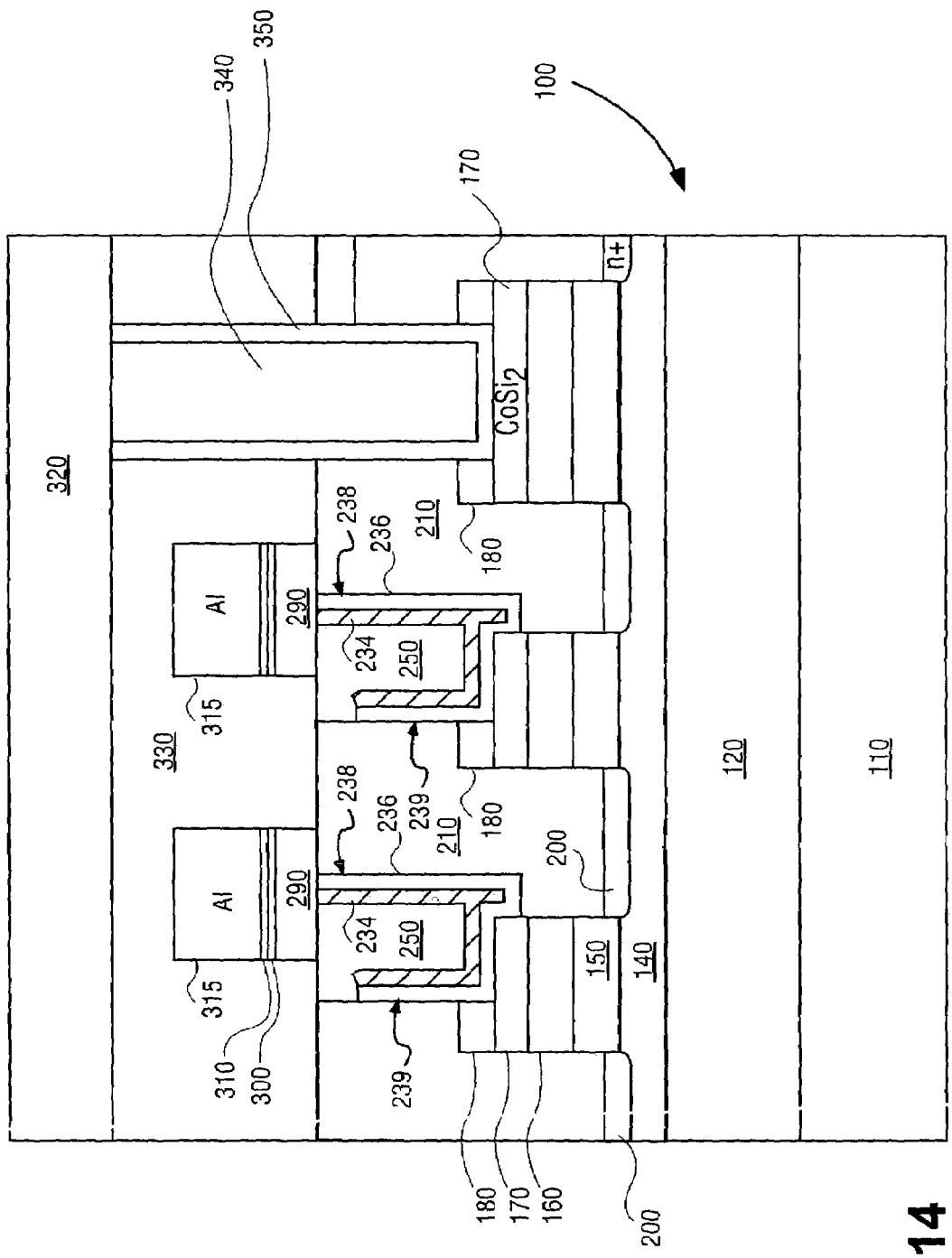
FIG. 14 shows the structure of FIG. 12, through the same cross-sectional view, after the introduction of a volume of memory material and second conductors over the structure, in accordance with one embodiment of the invention.

FIG. 14 shows the structure of FIG. 12 after the introduction of a volume of memory material 290 (represented as memory element 30 in FIG. 1). It can be seen that memory material 290 makes contact with first side 238 of lower electrode remainder 236. If there were to be a misalignment such that memory material 290 were also aligned over second side 239, no contact would be made. In this way, the dimensions of trench 220 may be made smaller and a higher memory cell packing density may be achieved over what has occurred in the prior art.

Because a smaller trench 220 may be patterned and one side of the lower electrode is removed, scaling of the lateral dimensions of the volume of memory material 290 need not be reduced. Alternatively, lateral dimensions of the volume of memory material 290 need not be reduced in a direct proportionality to the amount of reduction of the smaller trench 220. Where previously, a misalignment may have caused both matchsticks to contact the volume of memory material, thus making a parallel programming circuit, the same degree of misalignment when it occurs in the present invention has no such effect.

In one example, memory material 290 is a phase change material. In a more specific example, memory material 290 includes a chalcogenide element(s). Examples of phase change memory material 290 include, but are not limited to, compositions of the class of tellerium-germanium-antimony ($Te_xGe_ySb_x$) material in both stoichiometric and solid-solution ratios. The volume of memory material 290, in one example according to current technology, is introduced and patterned with a thickness on the order of about 600 Å. It can be seen that within memory material 290, only one electrode makes contact therewith.

Overlying the volume of memory material 290 in the structure of FIG. 14 are barrier materials 300 and 310 of, for example, titanium (Ti) and titanium nitride (TiN), respectively. Barrier material serves, in one aspect, to inhibit diffusion between the volume of memory material 290 and second conductor or signal line material overlying the volume of memory material 290 (e.g., second electrode 10). Overlying barrier materials 300 and 310 is second conductor or signal line material 315. In this example, second conductor or signal line material 315 serves as an address line, a column line (e.g., column line 10 of FIG. 1). Second conductor or signal line material 315 is patterned to be, in one embodiment, generally orthogonal to first conductor or signal line material 140 (column lines are orthogonal to row lines). Second conductor or signal line material 315 is, for example, an aluminum material, such as an aluminum alloy. Methods for the introduction and patterning of the barrier materials and second conductor or signal line material 315 include such techniques as known to those of skill in the art.

FIG. 14 also shows the structure of FIG. 12 after the introduction of dielectric material 330 over second conductor or signal line material 315. Dielectric material 330 is, for example, $SiO_2$ or other suitable material that surrounds second conductor or signal line material 315 and memory material 290 to electronically isolate such structure. Following introduction, dielectric material 330 is planarized and a via is formed in a portion of the structure through dielectric material 330, dielectric material 210, and masking material 180 to reducer material 170. The via is filled with conductive material 340 such as tungsten (W) and barrier material 350 such as a combination of titanium (Ti) and titanium nitride (TiN). Techniques for introducing dielectric material 330 forming and filling conductive vias, and planarizing are known to those skilled in the art.

The structure shown in FIG. 14 also shows additional conductor or signal line material 320 introduced and patterned to mirror that of first conductor or signal line material 140 (e.g., row line) formed on substrate 100. Mirror conductor line material 320 mirrors first conductor or signal line material 140 and is coupled to first conductor or signal line material 140 through a conductive via. By mirroring a doped semiconductor such as N-type silicon, mirror conductor line material 320 serves, in one aspect, to reduce the resistance of conductor or signal line material 140 in a memory array, such as memory array 5 illustrated in FIG. 1. A suitable material for mirror conductor line material 320 includes an aluminum material, such as aluminum or an aluminum alloy.

In the above description of forming a memory element such as memory element 15 in FIG. 1, metal compound film 230 is an electrode and is described between a memory material and conductors or signal lines (e.g., row lines and column lines) that has improved electrical characteristics. In the embodiment described, the resistivity of the electrode is selected to make a given metal compound film 230 as set forth herein. In this manner, a supplied voltage from second conductor or signal line material 320 or first conductor or signal line material 140 to the memory material 290 may be near the volume of memory material 290 and dissipation of energy to cause a phase change may be minimized. The discussion detailed the formation of one memory element of memory array 5. Other memory elements of memory array 5 may be fabricated in the same manner. It is to be appreciated that many, and possibly all, memory elements of memory array 5, along with other integrated circuit circuitry, may be fabricated simultaneously.

Figure 15:
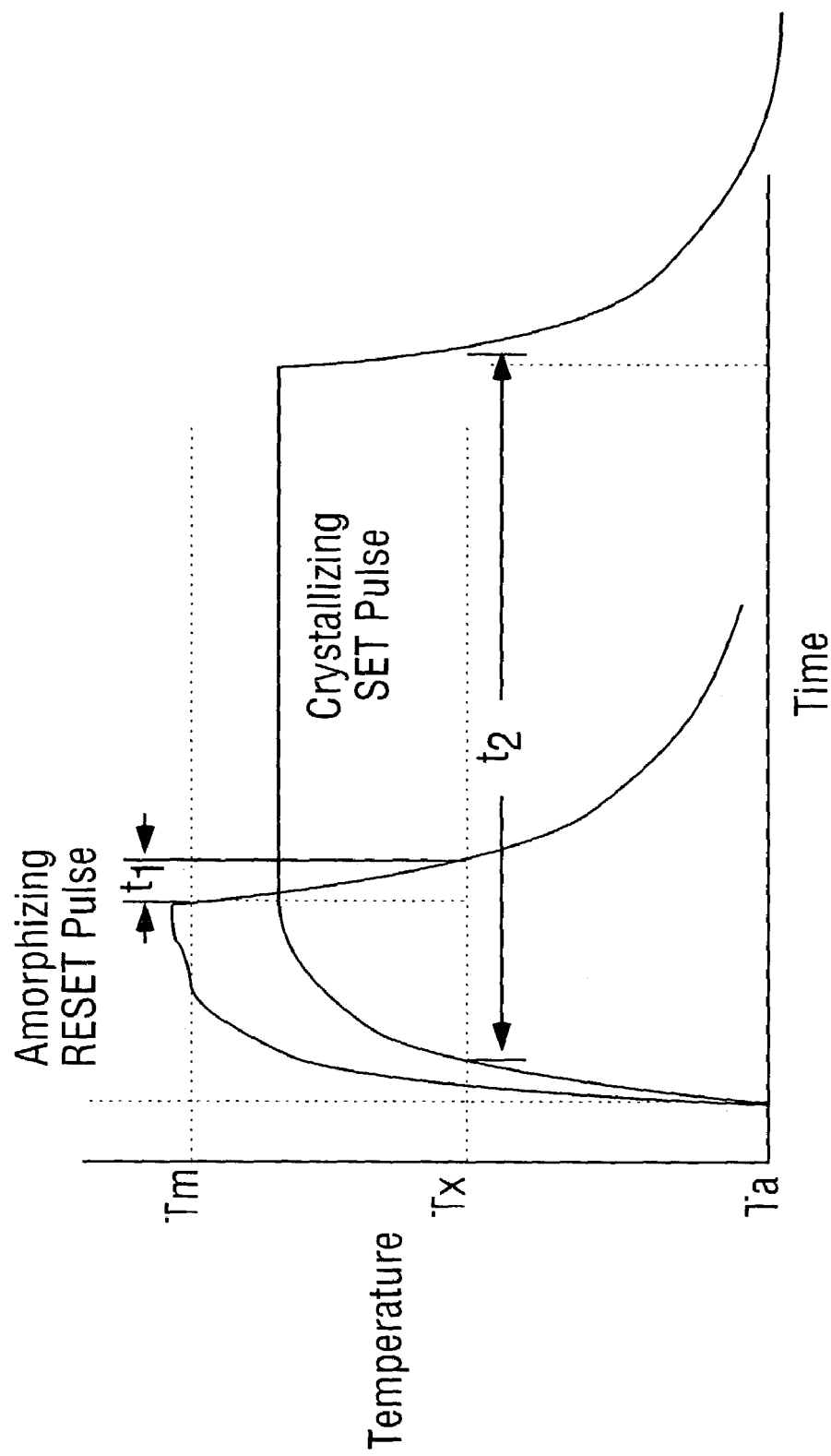
FIG. 15 shows a graphical representation of setting and resetting a volume of a phase change memory material in terms of temperature and time.
Figure 16A:
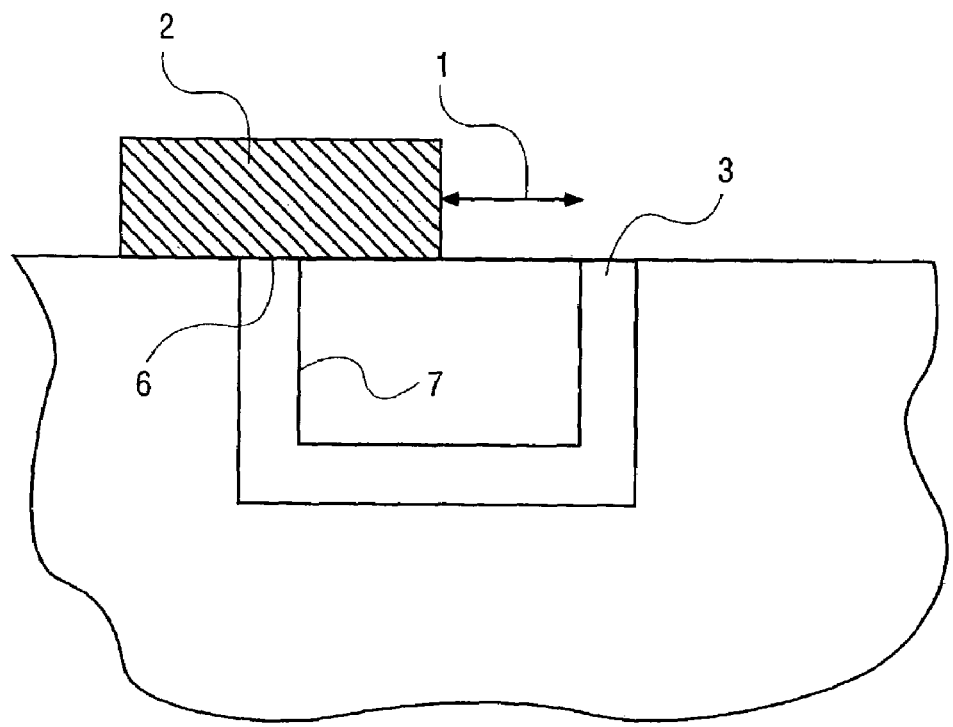
FIGS. 16a and 16b illustrate the problem of a smaller lower electrode.
Figure 16B:
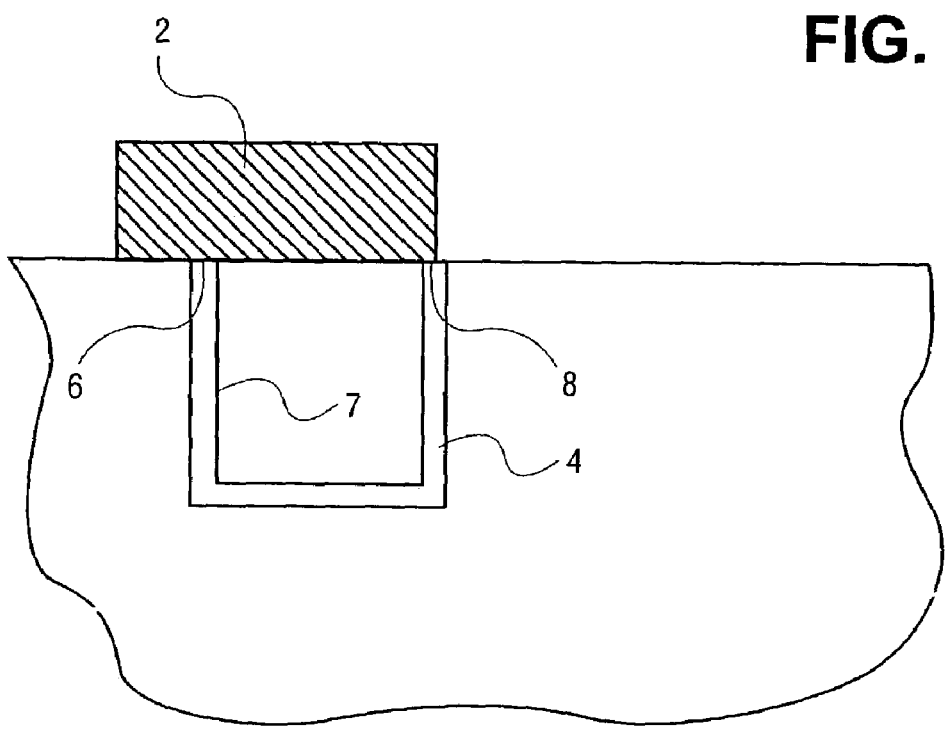

FIG. 15 presents a graphical representation of the setting and resetting of a volume of phase change memory material. Referring to FIG. 1, setting and resetting memory element 15 (addressed by column line 10a and row line 20a) involves, in one example, supplying a voltage to column line 10a to introduce a current into the volume of memory material 30 as illustrated in FIG. 1 or memory material 290 as illustrated in FIG. 12. The current causes a temperature increase at the volume of memory material 30. Referring to FIG. 14, to amorphize a volume of memory material 290, the volume of memory material is heated to a temperature beyond the amorphisizing temperature, $T_M$. Once a temperature beyond $T_M$ is reached, the volume of memory material is quenched or cooled rapidly (by removing the current flow). The quenching is accomplished at a rate, $t_1$ that is faster than the rate at which the volume of memory material 30 can crystallize so that the volume of memory material 30 retains its amorphous state. To crystallize a volume of memory material 30, the temperature is raised by current flow to the crystallization temperature for the material and retained at that temperature for a sufficient time to crystallize the material. After such time, the volume of memory material is quenched (by removing the current flow).

In each of these examples of resetting and setting a volume of memory material 30, the importance of concentrating the temperature delivery at the volume of memory material 30 is illustrated. One way this is accomplished is modifying a portion of the electrode as described above. The inset of FIG. 15 shows memory cell 15 having an electrode with modified portion 35 (illustrated as a resistor) to concentrate heat (current) at the volume of memory material 30.

In the preceding example, the volume of memory material 30 was heated to a high temperature to amorphize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 need not be partially set or reset by varying the current flow and duration through -the volume of memory material.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of forming a phase-change memory element comprising:

providing a lower electrode material in a recess of a phase-change memory cell substrate, wherein the lower electrode material comprises a first side within the recess and a second side within the recess and wherein the first side and the second side are on opposing sides of the recess;

forming a first dielectric layer over the lower electrode material;

etching the first dielectric layer under conditions to form an exposed portion of the second side within the recess; and removing the exposed portion of the second side within the recess without removing a significant portion of the first side within the recess.

2. The process according to claim 1, wherein etching the first dielectric layer comprises isotropic etching selective to the lower electrode material.

3. The process according to claim 1, wherein etching the first dielectric layer comprises isotropic wet etching selective to the lower electrode material.

4. The process according to claim 1, prior to said providing a lower electrode material, further comprising:
forming the recess in a container dielectric to expose an active area.

5. The process according to claim 1, wherein said providing a lower electrode comprises:
forming the recess in a container dielectric to expose an active area; and
chemical vapor depositing a polysilicon layer conformally in the recess and over the active area.

6. The process according to claim 1, wherein said providing a lower electrode comprises:
forming the recess in a container dielectric to expose an active area; and
plasma-enhanced chemical vapor depositing a polysilicon layer conformally in the recess and over the active area.

7. The process according to claim 1, wherein said providing a lower electrode comprises:
forming the recess in a container dielectric to expose an active area; and
depositing a metal compound layer conformally in the recess and over the active area, wherein the metal compound is selected from a metal nitride, a refractory metal nitride, a metal silicon nitride, a refractory metal silicon nitride, a metal suicide, and a refractory metal suicide.

8. The process according to claim 1, wherein said providing a lower electrode comprises:
forming the recess in a container dielectric to expose an active area; and
depositing a metal compound layer conformally in the recess and over the active area, wherein the metal compound layer is selected from tantalum nitride, titanium nitride, tungsten nitride, tanatalum silicon nitride, titanium silicon nitride, and tungsten silicon nitride.

9. The process according to claim 1, wherein providing the lower electrode material comprises providing the lower electrode material in the recess; and
following removing the exposed portion, the process further comprising:
filling the recess with a filler dielectric;
planarizing the semiconductor substrate under conditions to form a new upper level that exposes the first side but does not expose the second side; and
introducing a volume of phase-change memory material in contact with the first side.

10. A process of forming a lower electrode heater element in a phase-change memory cell comprising:
providing a lower electrode material in a recess, wherein the lower electrode material has a first side within the recess and a second side within the recess and wherein the first side and the second side are on opposing sides of the recess; and
removing at least a portion of the second side within the recess, without removing a significant portion of the first side within the recess.

11. The process according to claim 10, further comprising:
forming a first dielectric over the lower electrode material;
removing a portion of the first dielectric to expose the portion of the second side; and
removing the portion of the second side.

12. The process according to claim 11, wherein removing further comprises:
forming a first dielectric layer over the lower electrode material;
etching the first dielectric under conditions to substantially expose at least a portion of the second side; and
etching the lower electrode material to remove the exposed portion of the second side.

13. A method, comprising:
forming an electrode having a first portion within a recess over a substrate and a second portion within the recess over the substrate, wherein a length of the second portion within the recess is less than a length of the first portion within the recess, and wherein the first portion and the second portion are on opposing sides within the recess; and
forming a memory material contacting the first portion of the electrode, wherein forming the memory material includes forming a phase change material contacting the first portion of the electrode.

14. The method of claim 13, wherein forming the electrode comprises:
depositing a layer of electrode material in a trench so that the electrode material has a first vertical section that forms the first portion, a first horizontal section connected to the first vertical section, and a second vertical section connected to the first horizontal section, wherein the second vertical section forms the second portion; and
removing part of the second vertical section so that the length of the second portion within the recess is less than the length of the first portion within the recess.

* * * * *